United States Patent

Murata

[11] Patent Number: 5,963,324
[45] Date of Patent: *Oct. 5, 1999

[54] EXPOSURE APPARATUS AND METHOD RESPONSIVE TO LIGHT BEAM WAVELENGTH VARIATION

[75] Inventor: Minoru Murata, Kanagawa-ken, Japan

[73] Assignee: Nikon Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/729,190

[22] Filed: Oct. 11, 1996

[30] Foreign Application Priority Data

Oct. 16, 1995 [JP] Japan .................................... 7-266918

[51] Int. Cl.$^6$ ...................................................... G01B 9/02
[52] U.S. Cl. ......................... 356/363; 356/358; 356/361; 356/401
[58] Field of Search .................................... 356/345, 358, 356/363, 361, 401; 250/548

[56] References Cited

U.S. PATENT DOCUMENTS 5,483,343  1/1996  Iwamoto et al. ....................... 356/361

Primary Examiner—Robert H. Kim
Attorney, Agent, or Firm—Armstrong, Westerman, Hattori, McLeland & Naughton

[57] ABSTRACT

An exposure apparatus is provided with temperature sensors (25 and 26) to measure temperatures of air around laser beams from a reticle-side laser interferometer (22a) and a wafer-side laser interferometer (23a), together with an environmental sensor (31) for measuring an atmospheric pressure, humidity, and so forth. A main control system (13) as a host CPU instructs a reticle stage control system (27) and a wafer stage control system (28) to move a reticle and a wafer, respectively (step 201). During the reticle and wafer moving period, measured values by the temperature sensors (25 and 26) and the environmental sensor (31) are read, and a variation of the laser wavelength due to a change in the environmental data is corrected (step 202), and during subsequent scanning exposure, position control of the reticle and wafer stages is effected by using the corrected laser wavelength. Thus, the laser wavelength of the laser interferometers is corrected without an increase in the cost or a reduction of the throughput.

22 Claims, 4 Drawing Sheets

EXPOSURE APPARATUS AND METHOD RESPONSIVE TO LIGHT BEAM WAVELENGTH VARIATION

BACKGROUND OF THE INVENTION

1. Field of the Invention

The present invention relates to an exposure apparatus and method used in lithography processes to produce, for example, semiconductor devices, liquid-crystal display devices, imaging devices (e.g., CCDS), or thin-film magnetic heads. The present invention is applicable to one-shot exposure type projection exposure apparatuses and methods, but particularly suitably applied to step-and-scan or other scanning exposure type exposure apparatuses and methods, in which a mask and a photosensitive substrate are scanned synchronously with a part of a pattern image being projected onto the substrate, thereby photolithographically transferring the mask pattern onto the substrate.

2. Related Background Art

In photolithography processes for producing semiconductor devices and so forth, one-shot exposure type projection exposure apparatuses, i.e., steppers, have mainly been used, in which a pattern on a reticle (or a photomask or the like) is transferred by exposure onto each shot area on a wafer (or a glass plate) through a projection optical system in a stationary state. Recently, however, attention has been paid to scanning exposure type projection exposure apparatuses, i.e., slit scan type, step-and-scan type, etc., in which a reticle and a wafer are scanned relative to a projection optical system, thereby sequentially transferring a pattern formed on the reticle onto each shot area on the wafer, in order to comply with the demand that a pattern of wider area should be exposed with the image-formation characteristics maintained at the desired level. It is possible according to the scanning exposure type of projection exposure apparatus to use approximately the largest diameter portion of an effective exposure field of the projection optical system by illuminating the reticle with light in the form of a slit, by way of example. Moreover, by synchronously scanning the reticle and the wafer, the exposure field can be enlarged in the scanning direction without being restricted by the optical system. Furthermore, because only a part of the effective exposure field of the projection optical system is used, the required accuracies for illuminance uniformity, distortion, etc. can be readily obtained.

Positioning accuracy is one of important performances of the above-described projection exposure apparatuses. More specifically, a semiconductor device, for example, is formed by stacking a multiplicity of layers of different circuit patterns on a wafer. Therefore, a circuit pattern drawn on a reticle must be precisely overlaid on a pattern already formed on each shot area on a wafer. It is necessary in order to obtain a high overlay accuracy to use a stage mechanism for accurately positioning each of the reticle and wafer. The stage mechanism comprises a reticle stage for mounting a reticle, a wafer stage for mounting a wafer, drive mechanisms for driving the two stages, respectively, stage control systems for controlling the drive mechanisms, respectively, and a main control system for controlling the two stage control systems overall. In operation, the positions of the reticle and wafer stages are accurately measured, and the corresponding stage control systems are operated on the basis of the result of the measurement, thereby precisely aligning the reticle and the wafer. Accordingly, devices for precisely measuring the positions of the reticle and wafer stages also play an important part in the alignment.

Usually, laser interferometers are used to measure the positions of the reticle and wafer stages. In an apparatus that requires ultra-precise positioning, i.e., a projection exposure apparatus, when the wavelength of a laser beam used by a laser interferometer (i.e., laser wavelength) has changed owing to a variation in the refractive index of the air, a correction for the laser wavelength change must be made. If such a correction is not made, the positioning accuracy degrades. More specifically, the detecting part of a laser interferometer generally outputs one counting pulse (up-down pulse) every time an object of measurement moves through a distance $\lambda/N$, where $\lambda$ is the laser wavelength, and N is an integer, e.g., 32, 64, 50, etc. Therefore, the travel distance of the object is obtained by multiplying the summation of counting pulses by $\lambda/N$. Accordingly, if an incorrect value is used as the laser wavelength $\lambda$, it becomes a measurement error as it is. Therefore, the conventional practice is to install, in the apparatus, sensors for measuring an atmospheric pressure, temperature and humidity, respectively (hereinafter referred to as generically "environmental sensors"), and to calculate a refractive index of the air on the basis of measured values from these environmental sensors, and further to correct the laser wavelength at the rate of once a unit time of about 2 minutes under normal circumstances. To correct the laser wavelength, mainly the following two methods have heretofore been used.

According to a first method, as shown in FIG. 4A, a special-purpose controller for wavelength correction is provided in order to correct the laser wavelength. Referring to FIG. 4A, the laser wavelength is corrected by a special-purpose controller 51 whether the apparatus is of one-shot exposure type or scanning exposure type, and the result of the laser wavelength correction is supplied to a stage controller (aggregate of a main control system and a stage control system) 52. The stage controller 52 corrects measured data from a laser interferometer on the basis of the result of the laser wavelength correction. According to a second method, the laser wavelength is corrected by the stage controller itself without providing a special-purpose controller for laser wavelength correction.

FIG. 4B is a flowchart for explaining an example of a method of correcting the laser wavelength by the stage controller itself. The flowchart shows an example of an exposure process in which n-number of shot areas are exposed in a scanning exposure type projection exposure apparatus. As shown in FIG. 4B, first a variable i indicating a shot area number is set to 1 at step 301. Then, environmental data, i.e., atmospheric pressure, temperature, humidity, etc., is read out from environmental sensors at step 302, and at step 303, refractive index data necessary for laser wavelength correction is set at step 303. Next, at step 304, a variation of the laser wavelength due to a change in the environmental data is calculated on the basis of the set refractive index data, and the laser wavelength is corrected on the basis of the result of the calculation. In this case, the positions of the reticle and wafer have already been measured with the respective laser interferometers.

At the subsequent step 305, the reticle stage is positioned to a scanning start position on the basis of the corrected laser wavelength, and the i-th (1st, in this case) shot area is positioned to a scanning start position through the wafer stage. Next, environmental data, i.e., atmospheric pressure, temperature, humidity, etc., which has been supplied from the environmental sensors, is read again at step 306, and refractive index data necessary for laser wavelength correction is set at step 307. On the basis of the set refractive index data, the laser wavelength is corrected at step 308. At step 309, the reticle and wafer stages are synchronously controlled on the basis of the corrected laser wavelength while the positions of these stages are being measured with the respective laser interferometers, thereby carrying out scanning exposure to transfer a pattern formed on the reticle onto the shot area. Then, 1 is added to the shot area number i at step 310, and a comparison is made at step 311 as to whether or not the number i is greater than the total number n of shot areas. If the number i is not greater than the total number n of shot areas, the process is repeated from step 302. When the number i has become greater than the total number n of shot areas, the exposure process is terminated.

Of the above-described conventional laser wavelength correcting methods, the first method needs to install a special-purpose controller for laser wavelength correction, which causes the cost to increase. The second method suffers from the problem that, during the laser wavelength correcting operation, the reticle and wafer stages are at rest; therefore, the throughput (productivity) reduces correspondingly to the time required for the correcting operation. In this regard, in a one-shot exposure type projection exposure apparatus, once the wafer stage is positioned, exposure is carried out at this position. Therefore, no laser wavelength correction is made again before the exposure, and the reduction of the throughput is only slight. In a scanning exposure type projection exposure apparatus, however, laser wavelength correction is made again before the scanning exposure as at steps 306 to 308 in FIG. 4B. Accordingly, the throughput reduces to a considerable extent particularly in scanning exposure type projection exposure apparatuses.

SUMMARY OF THE INVENTION

An object of the present invention is to provide an exposure apparatus and method wherein, during a substrate stage stepping drive period or an exposure period, an amount of a variation in the wavelength of a light beam is obtained for carrying out the subsequent exposure, thereby eliminating the need of providing a distinct period of time for obtaining the wavelength variation, and thus improving the throughput, and wherein it is made unnecessary to provide a special-purpose controller, thereby enabling the cost to reduce.

To attain the above-described object, the present invention provides an exposure apparatus including a mask stage (11) for positioning a mask (R); a substrate stage (17) for positioning a substrate (W); an interferometer (23a) for measuring a position of the substrate stage (17) by using a light beam (30) for measurement; a sensor (26, 31) for detecting a change in an environment of an optical path of the light beam (30) used by the interferometer (23a); and a stage control mechanism (13 and 28) which obtains an amount of a variation in wavelength of the light beam (30) on the basis of a result of the detection obtained by the sensor (26, 31) in parallel to at least one of a driving operation for stepping the substrate stage (17) and an exposure operation for transferring a pattern formed on the mask onto a shot area on the substrate, and drives the substrate stage (17) on the basis of an amount of the variation in wavelength of the light beam and a value measured by the interferometer.

According to the exposure apparatus of the present invention, an amount of the variation in the wavelength of the light beam (30) is obtained during the stepping drive of the substrate stage (17) or during exposure. Therefore, a wavelength variation can be obtained without a reduction of the throughput. Further, because no special device is needed to obtain a wavelength variation, there is no increase in the cost.

In this case, it is preferable for the stage control mechanism (13 and 28) to have a first control device (28) for controlling at least one of the substrate stage (17) driving operation based upon the value measured by the interferometer (23a) and the wavelength of the light beam (30) and the exposure operation for transferring the pattern formed on the mask onto the shot area, and a second control device (13) for issuing a control start command to the first control device and for obtaining an amount of the variation in wavelength of the light beam (30) on the basis of the result of the detection by the sensor (26, 31). Thus, an amount of the variation in the wavelength of the light beam (30) can be obtained by the second control device (13) while the drive of the substrate stage (17) or exposure is being carried out by the first control device (28).

It is also preferable for the stage control mechanism (13 and 28) to obtain an amount of the variation in wavelength of the light beam (30) during execution of at least one of the driving operation for stepping the substrate stage and the exposure operation for transferring the pattern formed on the mask onto the shot area and to use the variation thus obtained for at least one of an exposure operation for transferring the mask pattern onto a subsequent shot area and a driving operation for stepping the substrate stage (17) to the subsequent shot area. Thus, measurement for the movement of the stage to a subsequent shot area or for subsequent exposure can be effectively carried out while there is no substantial change in the environmental conditions by using the laser wavelength corrected on the basis of the obtained amount of the variation in the wavelength of the light beam (30).

By way of example, the mask stage (11) moves the mask (R) in a predetermined direction (direction X), and the mask stage (11) and the substrate stage (17) are synchronously moved during exposure for transferring the pattern formed on the mask onto each shot area on the substrate (W). This means that the exposure apparatus is of a scanning exposure type, e.g., step-and-scan exposure apparatus.

In addition, the present invention provides an exposure method employing an exposure apparatus having a mask stage for positioning a mask having a pattern for transfer formed thereon, a substrate stage for positioning a photosensitive substrate, an interferometer for measuring a position of the substrate stage by using a light beam for measurement, and a stage control mechanism for driving the substrate stage on the basis of a value measured by the interferometer and a wavelength of the light beam, wherein the mask and the substrate are aligned with respect to each other by driving the substrate stage through the stage control mechanism, and the pattern on the mask is transferred onto each shot area on the substrate by exposure. The exposure method includes the steps of: preparing a sensor for detecting a change in an environment of an optical path of the light beam used by the interferometer; detecting a change in the environment of the optical path of the light beam by the sensor; and obtaining, by the stage control mechanism, an amount of a variation in wavelength of the light beam on the basis of a result of the detection obtained by the sensor in parallel to at least one of a driving operation for stepping the substrate stage and an exposure operation for transferring the pattern formed on the mask onto the shot area.

DESCRIPTION OF THE PREFERRED EMBODIMENTS

One embodiment of the exposure apparatus and method according to the present invention will be described below with reference to FIGS. 1 to 3. In this embodiment, the present invention is applied to a step-and-scan type projection exposure apparatus and method, in which a reticle and a wafer are scanned relative to a projection optical system, thereby sequentially transferring a pattern formed on the reticle onto each shot area on the wafer.

Figure 1:
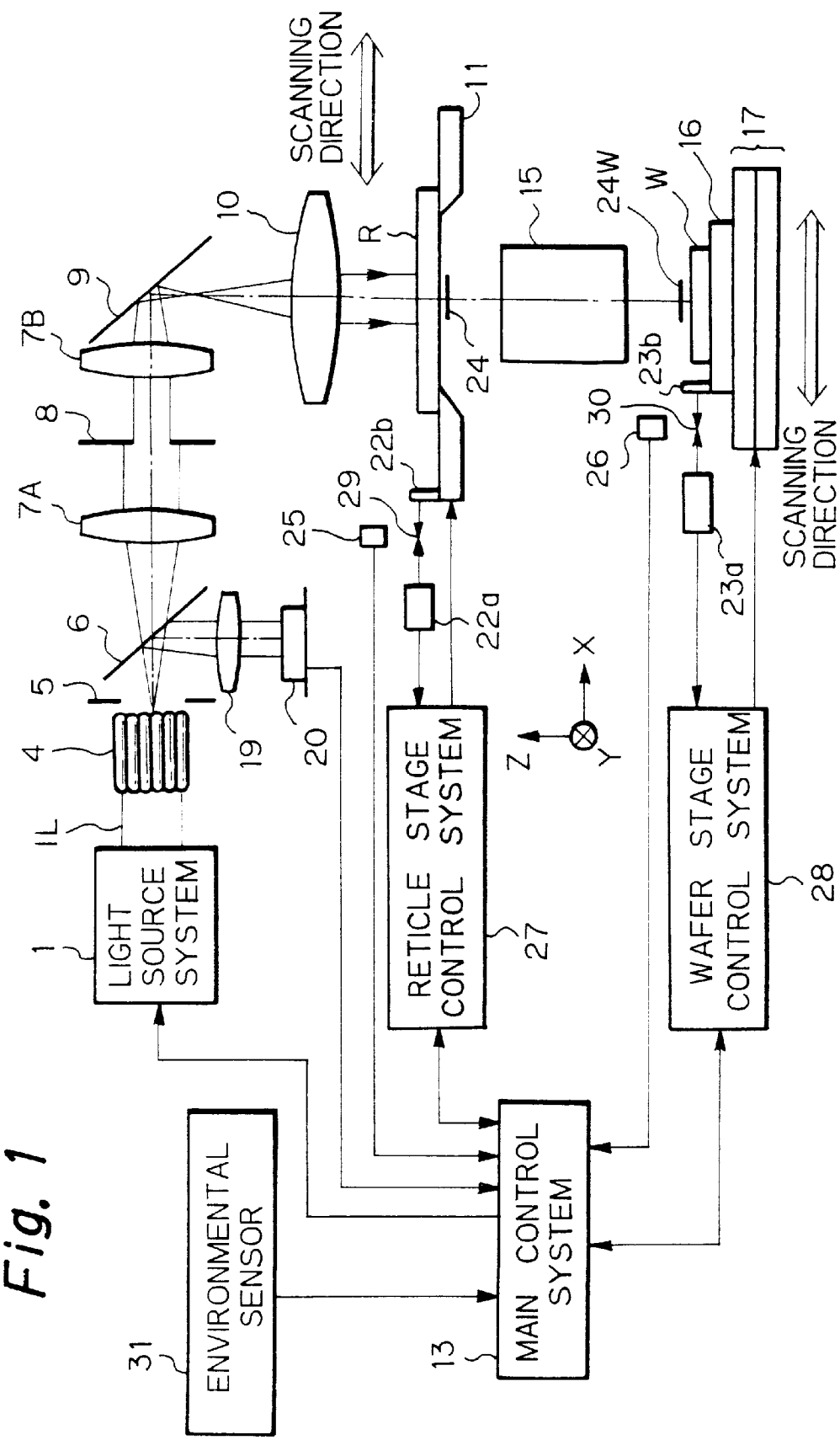
FIG. 1 schematically shows the arrangement of one embodiment of the exposure apparatus and method according to the present invention.

FIG. 1 schematically shows the arrangement of a projection exposure apparatus according to this embodiment. Referring to FIG. 1, a light source system 1 includes a light source and a light-reducing part for controlling the illuminance on a wafer W. Illuminating light IL emitted from the light source system 1 enters a fly's-eye lens 4. The light source system 1 is controlled by a main control system 13. The main control system 13 controls the light source and light-reducing part in the light source system 1 to control the illuminance of illuminating light IL on the wafer W. Examples of light usable as illuminating light IL include KrF excimer laser light, ArF excimer laser light, harmonics from a copper vapor laser and a YAG laser, and ultraviolet emission lines (g-line, i-line, etc.) from a super-high pressure mercury-vapor lamp. The fly's-eye lens 4 forms a large number of secondary light sources for illuminating a reticle R with a uniform illuminance distribution. An aperture stop 5 of an illumination system is disposed at an exit surface of the fly's-eye lens 4. Illuminating light IL emitted from secondary light sources within the aperture stop 5 enters a beam splitter 6 having a small reflectivity and a large transmittance. Illuminating light IL passing through the beam splitter 6 then passes successively through a first relay lens 7A and an aperture of a field stop 8.

The field stop 8 in this embodiment is arranged such that its aperture configuration is continuously changed by a blind driving system (not shown). Illuminating light IL passing through the field stop 8 passes via a second relay lens 7B, an optical path bending mirror 9 and a main condenser lens 10 to illuminate a slit-shaped illumination area 24 on the reticle R with a uniform illuminance distribution, the reticle R being placed on a reticle stage 11.

An image of a pattern in the illumination area 24 on the reticle R is projected onto a slit-shaped exposure area 24W on the wafer W as a demagnified image through a projection optical system 15 with a projection magnification β (β is ¼, for example), thereby exposing the exposure area 24W according to the transferred pattern. In the following description, a Z-axis is taken in a direction parallel to an optical axis of the projection optical system 15. An X-axis is taken in a scanning direction of the reticle R relative to the slit-shaped illumination area 24 in a plane perpendicular to the optical axis of the projection optical system 15 (i.e., a direction parallel to the plane of FIG. 1). A Y-axis is taken in a non-scanning direction, which is perpendicular to the scanning direction in a plane perpendicular to the optical axis of the projection optical system 15.

The reticle R is placed over a reticle stage 11 through a reticle holder (not shown). The reticle stage 11 effects positioning of the reticle R by slightly moving two-dimensionally in a plane (XY-plane) perpendicular to the optical axis of the projection optical system 15. The reticle stage 11 is also movable in the scanning direction (direction X) at a predetermined scanning speed. The reticle stage 11 has a stroke sufficient for the whole surface of the reticle R to cross at least the illumination area 24 in the scanning direction. A moving mirror 22b is fixed on a left-hand (−X direction) end portion of the reticle stage 11 to reflect a laser beam 29 from an external laser interferometer 22a. The position of the reticle stage 11 is constantly monitored by a combination of the laser interferometer 22a and the moving mirror 22b. Position information concerning the reticle stage 11 is sent from the laser interferometer 22a to a reticle stage control system 27, and it is also supplied to the main control system 13 through the reticle stage control system 27. The main control system 13 controls the position and speed of the reticle stage 11 on the basis of the position information through the reticle stage control system 27.

In the vicinity of the optical path of the laser beam 29 from the laser interferometer 22a, a temperature sensor 25 is installed to measure the temperature of air around the optical path of the laser beam 29. A measured value by the temperature sensor 25 is supplied to the main control system 13. The main control system 13 is also supplied with measured values for the atmospheric pressure and humidity, which are measured with the corresponding environmental sensors. The main control system 13 corrects the wavelength of the laser beam 29 on the basis of the measured value by the temperature sensor 25 and the measured values by the environmental sensors.

The wafer W is placed over a Z-tilt stage 16 through a wafer holder (not shown). The Z-tilt stage 16 is mounted on an XY-stage 17 which is driven in the directions X and Y through a wafer stage control system 28. The XY-stage 17 is controlled to perform a step-and-scan operation in which an operation of scan-exposing each shot area on the wafer W and an operation of moving the wafer W to a subsequent exposure start position are repeated. The wafer W is movable in the direction Z and tiltable relative to the XY-plane by the Z-tilt stage 16.

A moving mirror 23b is fixed on an end portion of the Z-tilt stage 16 to reflect a laser beam 30 from an external laser interferometer 23a. The position of the Z-tilt stage 16 (wafer W) is constantly monitored by a combination of the laser interferometer 23a and the moving mirror 23b. Positional information concerning the Z-tilt stage 16 is sent from the laser interferometer 23a to the wafer stage control system 28, and it is also supplied to the main control system 13 through the wafer stage control system 28. On the basis of the positional information, the main control system 13 controls the position and speed of the wafer W through the wafer stage control system 28.

In the vicinity of an optical path of the laser beam 30 from the laser interferometer 23a, a temperature sensor 26 is installed to measure the temperature of air around the optical path of the laser beam 30. A measured value by the temperature sensor 26 is supplied to the main control system 13. The main control system 13 corrects the wavelength of the laser beam 30 on the basis of the measured value from the temperature sensor 26 and a measured value by an environmental sensor 31.

In this embodiment, during scanning exposure, the reticle R is scanned in the direction +X (or direction −X) at a speed $V_R$, for example, and the wafer W is synchronously scanned in the direction −X (or direction +X) at a speed $V_W$. The ratio of the scanning speed $V_W$, to the scanning speed $V_R$R (i.e., $V_W/V_R$) is precisely coincident with the projection magnification p of the projection optical system 15. Thus, the pattern on the reticle R is accurately transferred onto each shot area on the wafer W.

Meanwhile, illuminating light reflected by the beam splitter 6 is received through a condenser lens 19 by an integrator sensor 20 comprising a photoelectric transducer, and a photoelectrically-converted signal generated from the integrator sensor 20 is supplied to the main control system 13. A relationship between the photoelectrically-converted signal from the integrator sensor 20 and the illuminance of illuminating light on the exposure surface of the wafer W has been obtained in advance, so that the luminous exposure on the wafer W is controlled on the basis of the photoelectrically-converted signal. The apparatus shown in FIG. 1 is further provided with an oblique incidence type focus position detecting system (not shown) for detecting a surface position and tilt angle of the wafer W, and a plurality of alignment sensors (not shown) for alignment of the reticle R and each shot area on the wafer W.

Next, the operation of the exposure apparatus according to this embodiment will be described.

Figure 2:
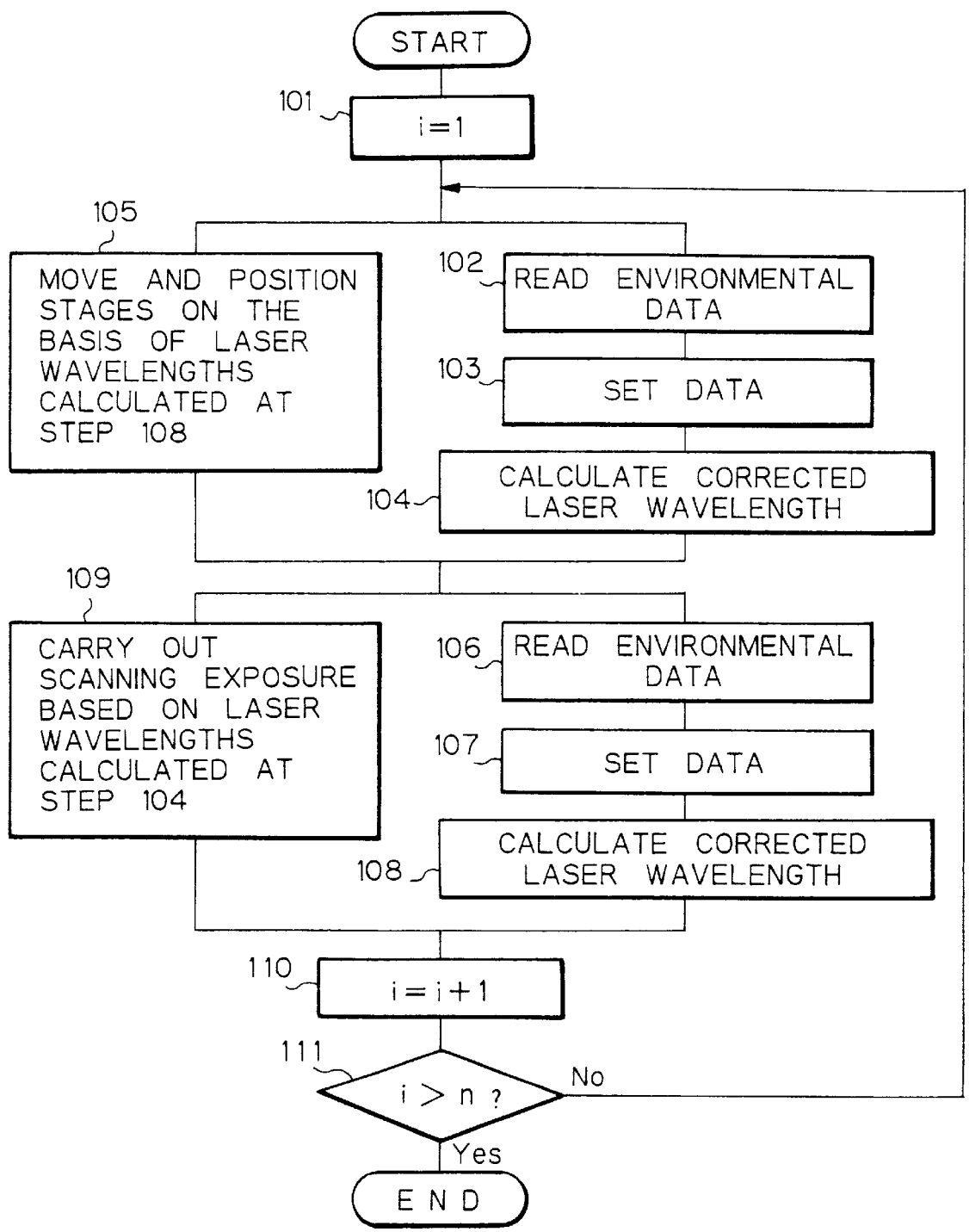
FIG. 2 is a flowchart showing one example of an exposure operation according to the embodiment.

FIG. 2 is a flowchart for describing one example of an exposure operation according to this embodiment. The flowchart shows a process sequence for exposing n-number of shot areas on the wafer W by using a scanning exposure type projection exposure apparatus. As shown in FIG. 2, first a variable i indicating a shot area number is set at step 101. Thereafter, operations at steps 102 to 104 and an operation at step 105 are executed in parallel. At step 102, measured values for atmospheric pressure, humidity and temperature are read from the temperature sensor 25 for measuring the air temperature around the laser beam 29 from the laser interferometer 22a and the temperature sensor 26 for measuring the air temperature around the laser beam 30 from the laser interferometer 23a. Then, air refractive index data necessary for the correction of the wavelength of the laser beams 29 and 30 is set at step 103.

Next, at step 104, accurate values for the wavelengths of the laser beams 29 and 30 are calculated on the basis of the refractive index data set as described above. In parallel to the series of operations at steps 102 to 104, the reticle stage 11 is positioned to the scanning start position at step 105 on the basis of laser wavelengths calculated at step 108 (described later) and a measured value by the laser interferometer 22a, and the XY-stage 17 is driven on the basis of the corrected wavelength of the laser beam 30 and a measured value by the laser interferometer 23a to position the XY-stage 17 to the scanning start position for the i-th shot area. It should, however, be noted that during the movement for the 1st shot area, laser wavelengths obtained immediately before the movement are used in place of the laser wavelengths corrected at step 108. The above-described parallel processing is an advantageous feature of this embodiment, and it is attained by effectively utilizing the features of control systems in the stage control mechanism (stage controller), which will be explained below.

Figure 3A:
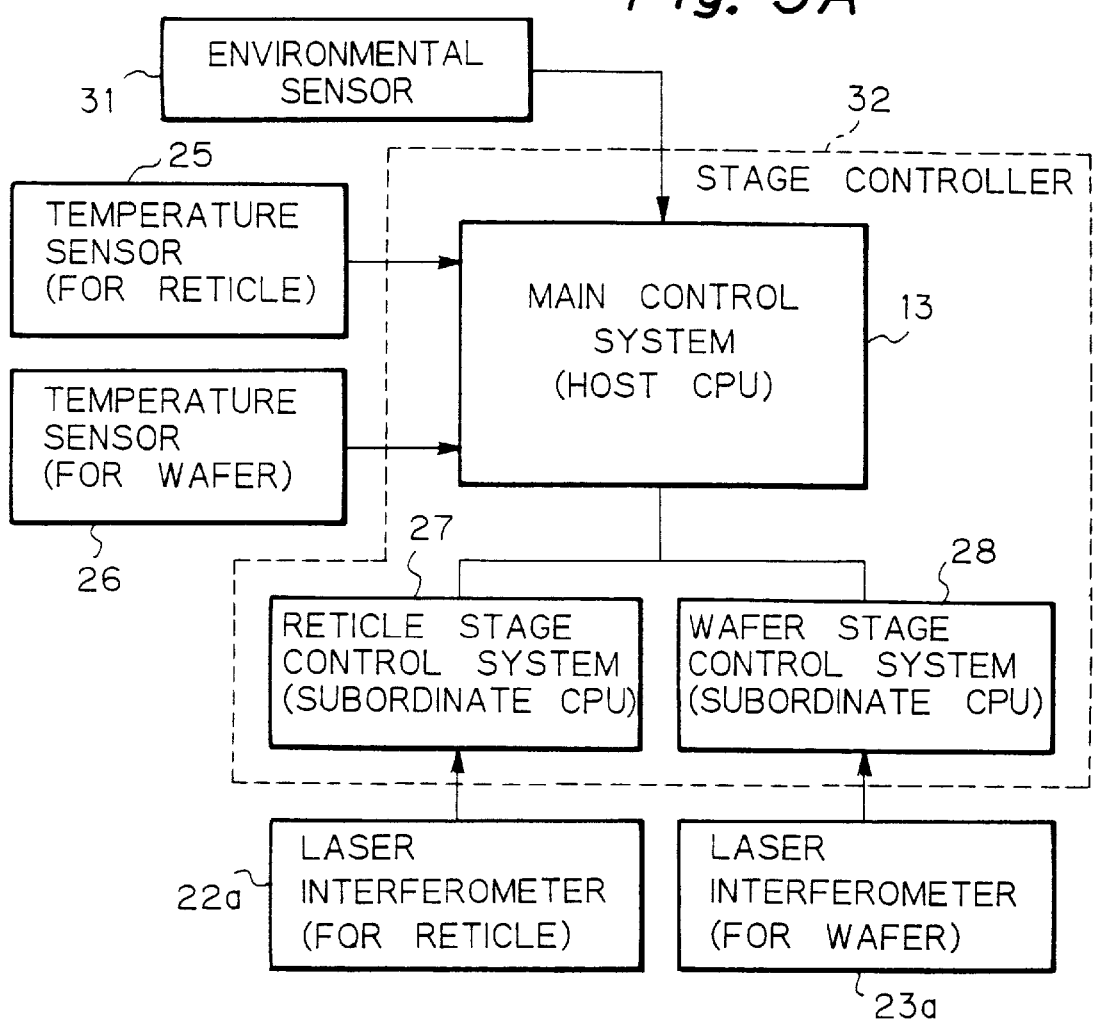
FIG. 3A is a block diagram showing a stage control mechanism shown in FIG. 1.
Figure 3B:
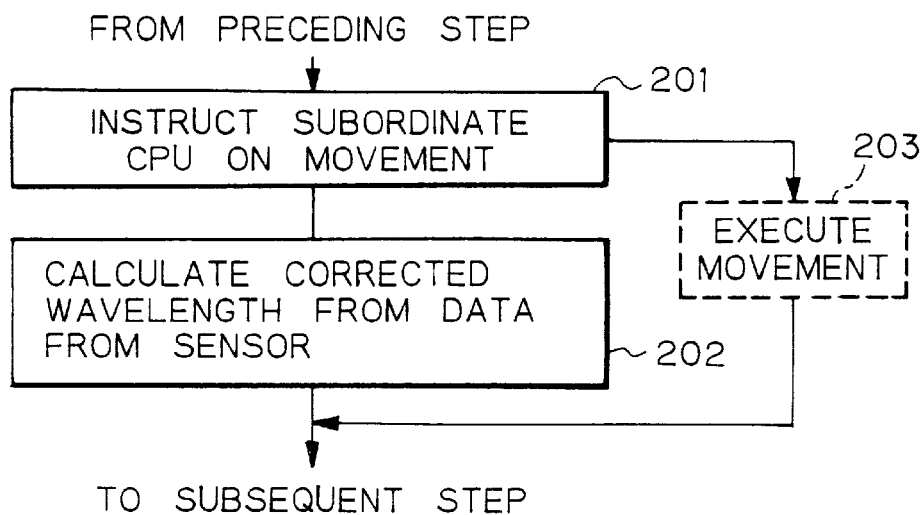
FIG. 3B is a flowchart showing operations of control systems constituting the stage control mechanism.
Figure 4A:
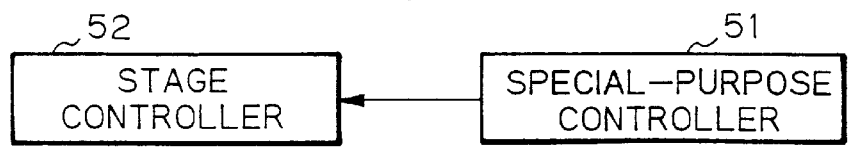
FIG. 4A is a block diagram showing the arrangement of one example of a mechanism for correcting the wavelength of a laser beam in a conventional exposure apparatus.
Figure 4B:
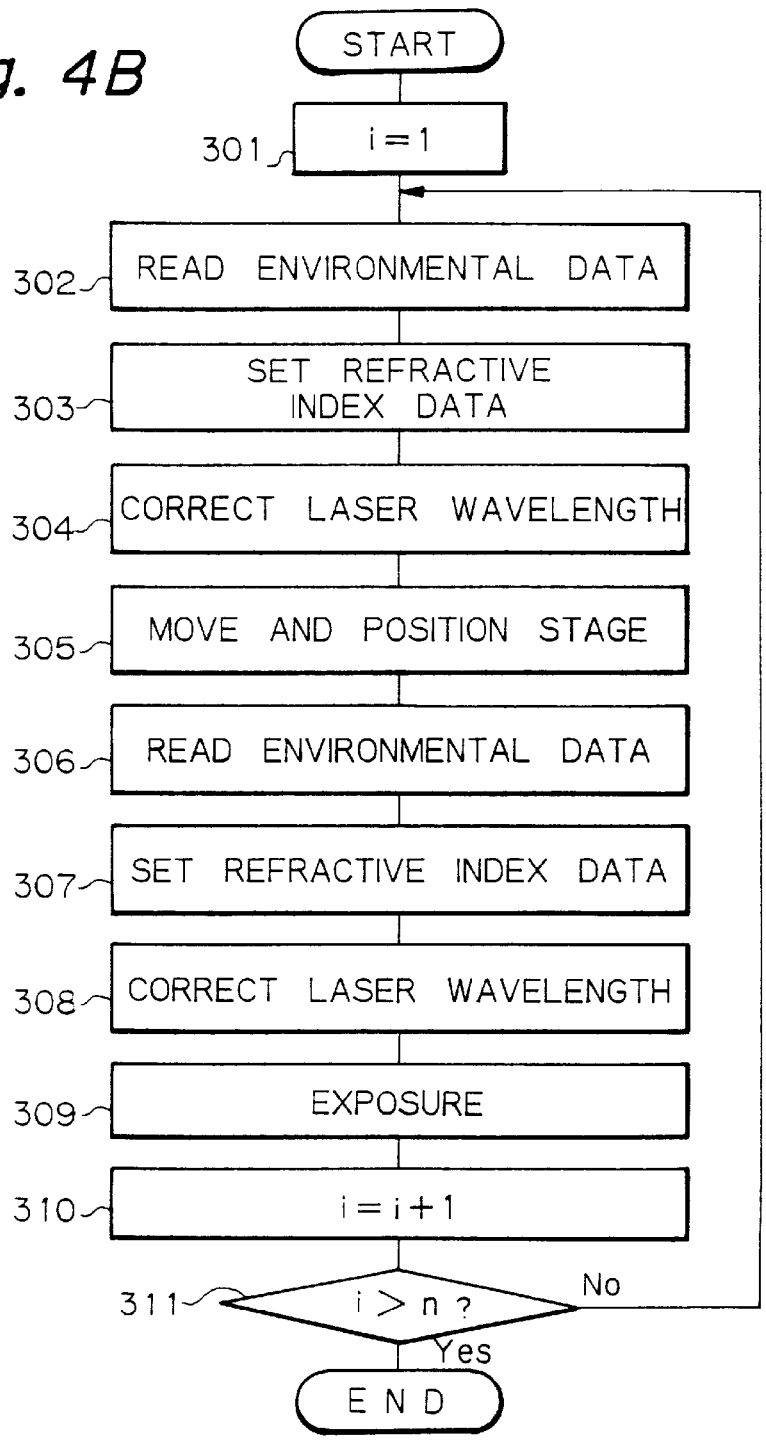
FIG. 4B is a flowchart showing one example of an exposure operation in another conventional exposure apparatus.

FIG. 3A is a block diagram showing the arrangement of a stage controller according to this embodiment, and FIG. 3B is a flowchart showing an operation of each control system in the parallel processing. Referring to FIG. 3A, a stage controller 32 comprises the reticle stage control system 27 for controlling the drive of the reticle stage 11, shown in FIG. 1, and the wafer stage control system 28 for controlling the drive of the XY-stage 17, shown in FIG. 1. The main control system 13 may be regarded as a host CPU which controls the sequence of the reticle and wafer stage control systems 27 and 28, which may be regarded as subordinate CPUs. In the following description, the main control system 13 is referred to as "host CPU 13", and the reticle and wafer stage control systems 27 and 28 are referred to as "first subordinate CPU 27" and "second subordinate CPU 28", respectively.

The host CPU 13 is supplied with environmental data from the environmental sensor 31, the reticle-side temperature sensor 25 and the wafer-side temperature sensor 26. The host CPU 13 can read the environmental data at any time. The first and second subordinate CPUs 27 and 28 are supplied with measured values from the laser interferometers 22a and 23a, respectively. The measured values from the laser interferometers 22a and 23a are also supplied to the host CPU 13 through the respective subordinate CPUs 27 and 28.

The parallel processing at steps 102 to 104 and step 105 in FIG. 2 is executed by making use of a time lag between the operations of the host CPU 13 and the subordinate CPUs 27 and 28. Assuming that exposure is to be carried out for a second or later shot area, FIG. 3B illustrates the operation of the host CPU 13 at steps 201 and 202, and the operation of the subordinate CPUs 27 and 28 at step 203. As shown in FIG. 3B, upon completion of an exposure operation for the preceding shot area, the host CPU 13 instructs the subordinate CPUs 27 and 28 to execute movement to the subsequent shot area at step 201. According to the instruction, the subordinate CPUs 27 and 28 drive the respective stages to move to predetermined positions, respectively, at step 203. In this case, the host CPU 13 is on standby while the subordinate CPUs 27 and 28 are executing the movement of the respective stages according to the instruction from the host CPU 13. Accordingly, during the waiting time, the host CPU 13 reads environmental data, sets refractive index data and performs a calculation for correction of the laser wavelength for a variation due to a change in the environmental data at step 202. Upon completion of the stage movement at step 203, the process proceeds to the subsequent step for scanning exposure.

Referring to FIG. 2 again, upon completion of both steps 104 and 105, parallel processing is executed again in two operation sequences, i.e., at steps 106 to 108 and at step 109. More specifically, at steps 106 to 108, reading of environmental data, setting of refractive index data and corrective calculation of laser wavelengths are executed in the same way as at the above-described steps 102 to 104. Meanwhile, at step 109, the reticle stage 11 and the XY-stage 17 are synchronously scanned while the positions thereof are being measured on the basis of the laser wavelengths calculated at step 104 and the measured values by the laser interferometers 22a and 22b, thereby allowing the pattern on the reticle R to be sequentially transferred onto the i-th shot area.

After the completion of both the above-described steps 108 and 109, 1 is added to the shot area number i at step 110, and a comparison is made at step 111 as to whether or not the shot area number i is greater than the total number n of shot areas. If the number i is not greater than the total number n of shot areas, the process is repeated from steps 102 and 105. When the number i has become greater than the total number n of shot areas, the exposure process is terminated. As has been described above, the laser wavelengths corrected at step 108 are used as the wavelengths of the laser beams 29 and 30 from the laser interferometers 22a and 23a, which are used for the stage movement and positioning at step 105 when the process returns thereto.

Thus, in the projection exposure apparatus according to this embodiment, the operation of the main control system 13 as a host CPU and the operations of the reticle and wafer stage control systems 27 and 28 as subordinate CPUs are executed in parallel, whereby the wavelength of a laser beam from each laser interferometer is corrected for a variation due to a change in environmental data during the movement of the reticle stage 11 and the XY-stage 17 and during the scanning exposure. Accordingly, it is possible to shorten the time required for corrective calculation of a laser wavelength. Moreover, because no special device is needed, the throughput (productivity) can be improved without an increase in the cost.

It should be noted that the present invention is applicable not only to scanning exposure type projection exposure apparatuses but also to one-shot exposure type exposure apparatuses, e.g., steppers, in which a pattern on a reticle is photolithographically transferred onto each shot area on a wafer in a stationary state.

Thus, the present invention is not necessarily limited to the above-described embodiment, but may adopt various arrangements without departing from the gist of the present invention.

Advantageous Effects of the Invention

According to the exposure apparatus and method of the present invention, there is no need of a special device, e.g., a special-purpose controller, for obtaining an amount of a variation in the wavelength of a light beam, and there is no suspension of the movement and exposure operations of the substrate stage, which are essential operations thereof. Therefore, the wavelength of the light beam can be corrected without increasing the cost or reducing the throughput.

In a case where the stage control mechanism has a first control device which controls at least one of the operations, that is, the drive of the substrate stage on the basis of a measured value by an interferometer and the wavelength of the light beam, and the transfer of a mask pattern onto a shot area by exposure, and a second control device which instructs the first control device to start the control and also obtains a variation in the wavelength of the light beam on the basis of the result of detection by a sensor, an amount of a variation in the wavelength of the light beam can be obtained by the second control device while the drive of the substrate stage or the exposure is being executed by the first control device.

In a case where the stage control mechanism obtains a variation in the wavelength of the light beam during execution of at least one of the stepping drive of the substrate stage and the transfer of the mask pattern onto a shot area by exposure, and uses an amount of the variation thus obtained for at least one of the transfer of the mask pattern onto a subsequent shot area and the stepping drive of the substrate stage to the subsequent shot area, it is possible to effectively carry out measurement during the stage movement to the subsequent shot area or the subsequent exposure while there is substantially no change in environmental conditions by using the wavelength of the light beam corrected at the preceding shot area.

The arrangement may be such that the mask stage moves the mask in a predetermined direction, and the mask stage and the substrate stage are synchronously moved when the pattern on the mask is transferred onto each shot area on the substrate by exposure. In this case, in a scanning exposure type exposure apparatus, the laser wavelength is corrected during at least one of the period of movement of the substrate stage to the subsequent shot area and the period of scanning exposure for the subsequent shot area. Therefore, the wavelength correction can be executed without reducing the throughput. Accordingly, the present invention provides particularly advantageous effects.

What is claimed is:

1. A scanning exposure apparatus comprising:

a projection system, disposed between a mask and a substrate, which projects a pattern image on one side thereof, a mask stage, disposed on the other side of said projection system, which moves said mask;

a substrate stage, disposed on the one side of said projection system, which moves said substrate;

an interferometer, optically connected with said substrate stage, which measures a position of said substrate stage by using a light beam for measurement;

a sensor to detect a change in an environment of an optical path of said light beam used by said interferometer; and a stage control system, connected to said sensor which obtains at least one of a first variation amount of a wavelength of said light beam on the basis of a result of the detection obtained by said sensor during a scanning exposure operation for transferring a pattern formed on said mask onto a shot area on said substrate, and a second variation amount of a wavelength of said light beam on the basis of a result of the detection obtained by said sensor during a driving operation for moving said substrate stage to a subsequent shot area after the scanning exposure operation for said shot area, and said stage control system performs at least one of a first driving operation to drive said substrate stage to a subsequent shot area on the basis of said amount of the first variation amount and a value measured by said interferometer, and a second driving operation to drive said substrate stage during a scanning exposure operation for the subsequent shot area on the basis of said second variation amount and a value measured by said interferometer.

2. A scanning exposure apparatus according to claim 1, wherein said stage control system has:

a first control device to control at least one of said substrate stage driving operation and said exposure operation for transferring the pattern formed on said mask onto said shot area, and a second control device to obtain said amount of the variation in wavelength of said light beam on the basis of the result of the detection by said sensor.

3. A scanning exposure apparatus according to claim 1, wherein said mask stage moves said mask in a predetermined direction, and wherein said mask stage and said substrate stage are synchronously moved during scanning exposure for transferring the pattern formed on said mask onto each shot area on said substrate.

4. A scanning exposure apparatus according to claim 1, wherein said sensor detects at least one of an atmospheric pressure, humidity, and temperature in surroundings of the optical path of said light beam for measurement.

5. A scanning exposure method employing an exposure apparatus having a mask stage to position a mask having a pattern for transfer formed thereon, a substrate stage to position a substrate, an interferometer to measure a position of said substrate stage by using a light beam for measurement, and a stage control system to drive said substrate stage on the basis of a value measured by said interferometer and a wavelength of said light beam, the pattern on said mask is transferred onto each shot area on said substrate by scanning exposure, said scanning exposure method comprising:

detecting a change in an environment of an optical path of said light beam used by said interferometer;

obtaining at least one of a first variation amount of a wavelength of said light beam on the basis of the detected change in the environment during a scanning exposure operation for a shot area on said substrate, and a second variation amount of a wavelength of said light beam on the basis of the detected change in the environment during a driving operation for moving said substrate stage to a subsequent shot area after the scanning exposure operation for said shot area; and at least one of a first driving operation which drives said substrate stage to a subsequent shot area on the basis of said first variation amount, and a second driving operation which drives said substrate stage during a scanning exposure operation for the subsequent shot area on the basis of said second variation amount.

6. A scanning exposure method according to claim 5, wherein said mask stage moves said mask in a predetermined direction, and wherein said mask stage and said substrate stage are synchronously moved during the scanning exposure operation to transfer the pattern formed on said mask onto each shot area on said substrate.

7. A scanning exposure method according to claim 5, wherein said amount of the variation in wavelength of said light beam is obtained by said stage control system.

8. A scanning exposure apparatus in which a pattern formed on a mask is transferred onto a substrate, the apparatus comprising:

a projection system, disposed between said mask and said substrate, which projects a pattern image on one side thereof, a mask stage, disposed on the other side of said projection system, which moves said mask;

a substrate stage, disposed on the one side of said projection system which moves said substrate;

an interferometer system, optically connected with said substrate stage and said mask stage, which measures position data of said substrate stage and said mask stage by using a light beam;

a sensor which detects data related to a refractive index of an optical path of said light beam, and a control system, connected to said interferometer and said sensor, which obtains an amount of a variation in wavelength of said light beam on the basis of a result of the detection obtained by said sensor during a scanning exposure operation for a shot area on said substrate.

9. A scanning exposure apparatus according to claim 8, wherein said data related to a refractive index includes at least one of an atmospheric pressure, humidity, and temperature.

10. A scanning exposure method comprising:

detecting data related to a refractive index of an optical path of said light beam; and obtaining an amount of a variation in wavelength of said light beam on the basis of the detected data during a scanning exposure operation for a shot area on said substrate.

11. A scanning exposure method according to claim 10, wherein said detected data related to a refractive index includes an environmental information on said optical path.

12. A scanning exposure method according to claim 11, wherein said environmental information on said optical path includes at least one of an atmospheric pressure, humidity, and temperature.

13. A scanning exposure method according to claim 10, wherein said mask and substrate move synchronously with each other during said scanning exposure operation.

14. A scanning exposure method according to claim 10, wherein said obtained amount of said variation in wavelength of said light beam is used after said scanning exposure operation for said shot area and before a scanning exposure operation for a next shot area.

15. A scanning exposure method according to claim 10, wherein said interferometer system measures position data of said mask and said substrate during scanning exposure operation.

16. A scanning exposure method according to claim 15, wherein said mask and said substrate are moved synchronously based on the measured position data.

17. A scanning exposure method according to claim 10, further comprising:

obtaining an amount of a variation in a wavelength of said light beam on the basis of the detected data, after said scanning exposure operation for said shot area and before a scanning exposure operation for a next shot area.

18. A method for making a substrate device by using a method defined by claim 10.

19. A method for making a scanning exposure apparatus in which a pattern formed on a mask is transferred onto a substrate, the method comprising:

providing a projection system, disposed between said mask and said substrate, which projects a pattern image on one side thereof;

providing a mask stage, disposed on the other side of said projection system, which moves said mask;

providing a substrate stage, disposed on the one side of said projection system, which moves said substrate;

providing an interferometer system, optically connected with said substrate stage and said mask stage, which is used for moving said mask stage and said substrate stage synchronously;

providing a sensor which detects data related to a reflective index of an optical path of a light beam used by said interferometer system;

providing a control system, connected to said interferometer and said sensor, which obtains an amount of a variation in wavelength of said light beam on the basis of a result of the detection obtained by said sensor during a scanning exposure for a shot area on said substrate.

20. A method according to claim 19, wherein said detected data related to a refractive index includes an environmental information of said optical path.

21. A method according to claim 20, wherein said environmental information of said optical path includes at least one of an atmospheric pressure, humidity, and temperature.

22. A method according to claim 19, wherein said obtained amount of said variation in wavelength of said light beam is used after said scanning exposure operation for said shot area and before a scanning exposure operation for a next shot area.

* * * * *